(12) United States Patent
Karweck et al.

(10) Patent No.: US 9,898,193 B2
(45) Date of Patent: Feb. 20, 2018

(54) APPLICATION-SPECIFIC INTEGRATED CIRCUIT AND MEASUREMENT TRANSMITTER HAVING SUCH A CIRCUIT

(71) Applicant: Endress + Hauser GmbH + Co. KG, Maulburg (DE)

(72) Inventors: Lars Karweck, Binzen (DE); Andreas Spitz, Schopfheim (DE); Yves Boulenger, Schopfheim (DE); Richard Wagner, Efringen-Kirchen (DE); Klaus Winter, Steinen (DE); Thomas Zieringer, Schopfheim (DE)

(73) Assignee: Endrss + Hauser GmbH + Co. KG, Maulburg (DE)

( * ) Notice: Subject to any disclaimer, the term of this patent is extended or adjusted under 35 U.S.C. 154(b) by 687 days.

(21) Appl. No.: 14/372,482

(22) PCT Filed: Jan. 21, 2013

(86) PCT No.: PCT/EP2013/051046
§ 371 (c)(1),
(2) Date: Jul. 16, 2014

(87) PCT Pub. No.: WO2013/110570
PCT Pub. Date: Aug. 1, 2013

(65) Prior Publication Data
US 2014/0358454 A1 Dec. 4, 2014

(30) Foreign Application Priority Data
Jan. 23, 2012 (DE) ........................ 10 2012 001 098

(51) Int. Cl.
*H03M 1/12* (2006.01)
*G06F 3/05* (2006.01)
(Continued)

(52) U.S. Cl.
CPC .................. *G06F 3/05* (2013.01); *G01F 1/34* (2013.01); *G01F 23/14* (2013.01); *G06F 1/324* (2013.01);
(Continued)

(58) Field of Classification Search
None
See application file for complete search history.

(56) References Cited

U.S. PATENT DOCUMENTS 4,308,585 A 12/1981 Jordan
4,638,451 A 1/1987 Hester
(Continued)

FOREIGN PATENT DOCUMENTS

| CN | 1808285 A | 7/2006 |
|----|-----------|--------|
| CN | 101483730 A | 7/2009 |
| DE | 2939787 A1 | 4/1980 |

OTHER PUBLICATIONS

English Translation of the International Preliminary Report on Patentability, WIPO, Geneva, dated Aug. 7, 2014.
(Continued)

*Primary Examiner* — Howard Williams
(74) *Attorney, Agent, or Firm* — Bacon & Thomas, PLLC

(57) ABSTRACT

An application-specific integrated circuit comprises: analog inputs having analog-digital converters; at least one digital signal processor, which has input registers and output registers. The analog-digital converters sample and digitize input signals $S_i$ with sampling frequencies $f_{Si}$ and forward the digitized signals $SD_i$ with output frequencies $f_{SD\text{-}out\text{-}i}$ to the input registers of the digital signal processor. The digital signal processor processes the digitized signals $SD_i$ to m processed signals $SP_j$ and forwards such to the output registers of the digital signal processor. The digital signal processor has a clock frequency, wherein, furthermore, the
(Continued)

signals of the output registers can be output, respectively read-out, with an output frequency. One or more of the frequencies is, respectively, variable, wherein especially one or more of the frequencies, respectively, variable independently of the others of the frequencies.

2 Claims, 4 Drawing Sheets

(51) Int. Cl.
 *G01F 1/34* (2006.01)
 *G06F 1/32* (2006.01)
 *G01F 23/14* (2006.01)
(52) U.S. Cl.
 CPC ....... *H03M 1/1255* (2013.01); *Y02B 60/1217* (2013.01)

(56) References Cited

U.S. PATENT DOCUMENTS

| | | | | |
|---|---|---|---|---|
| 5,457,456 | A * | 10/1995 | Norsworthy | H03H 17/0671 341/143 |
| 6,557,418 | B2 * | 5/2003 | Tsuji | G01C 5/06 73/723 |
| 6,985,831 | B2 * | 1/2006 | Ito | G01D 9/005 702/188 |
| 2005/0242860 | A1 | 11/2005 | Yun et al. | |
| 2008/0260044 | A1 | 10/2008 | Yun et al. | |

OTHER PUBLICATIONS

International Search Report, EPO, The Netherlands, dated Apr. 26, 2013.

* cited by examiner

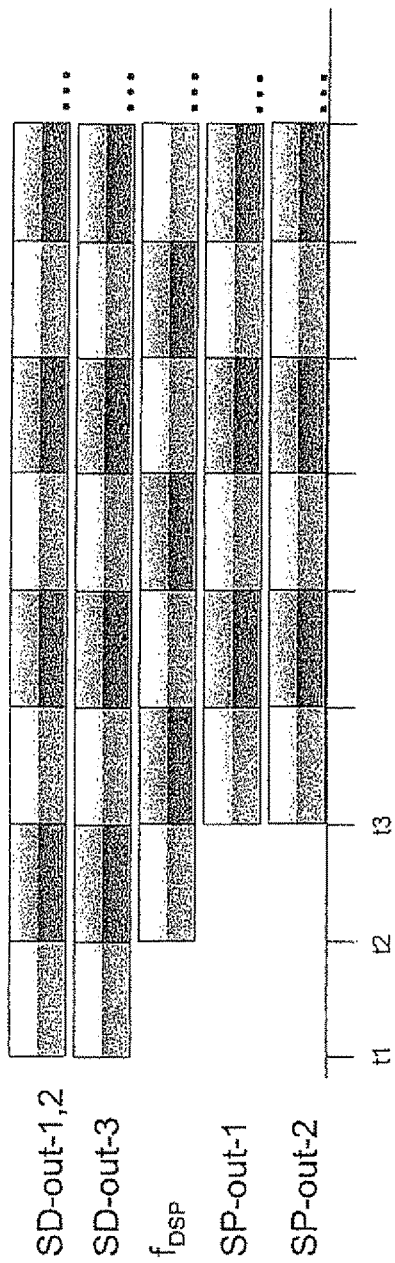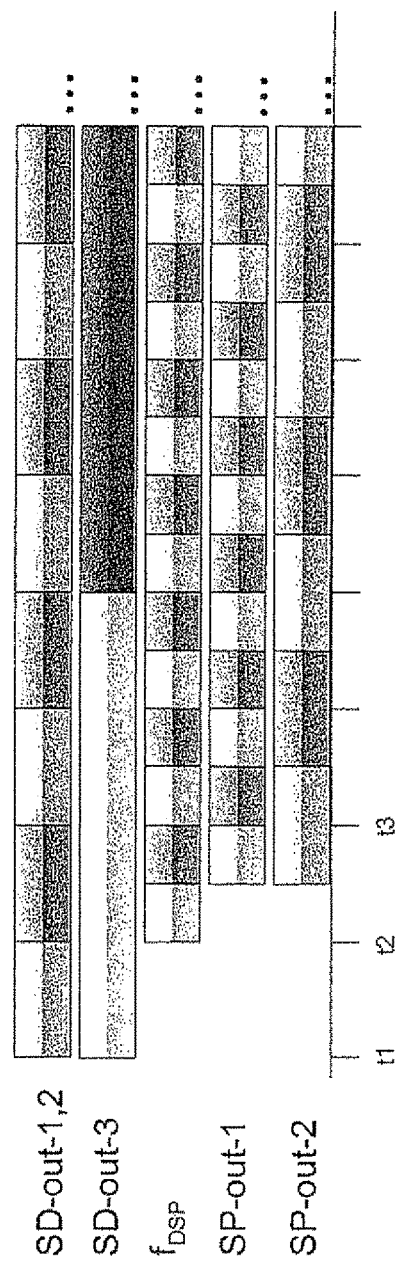

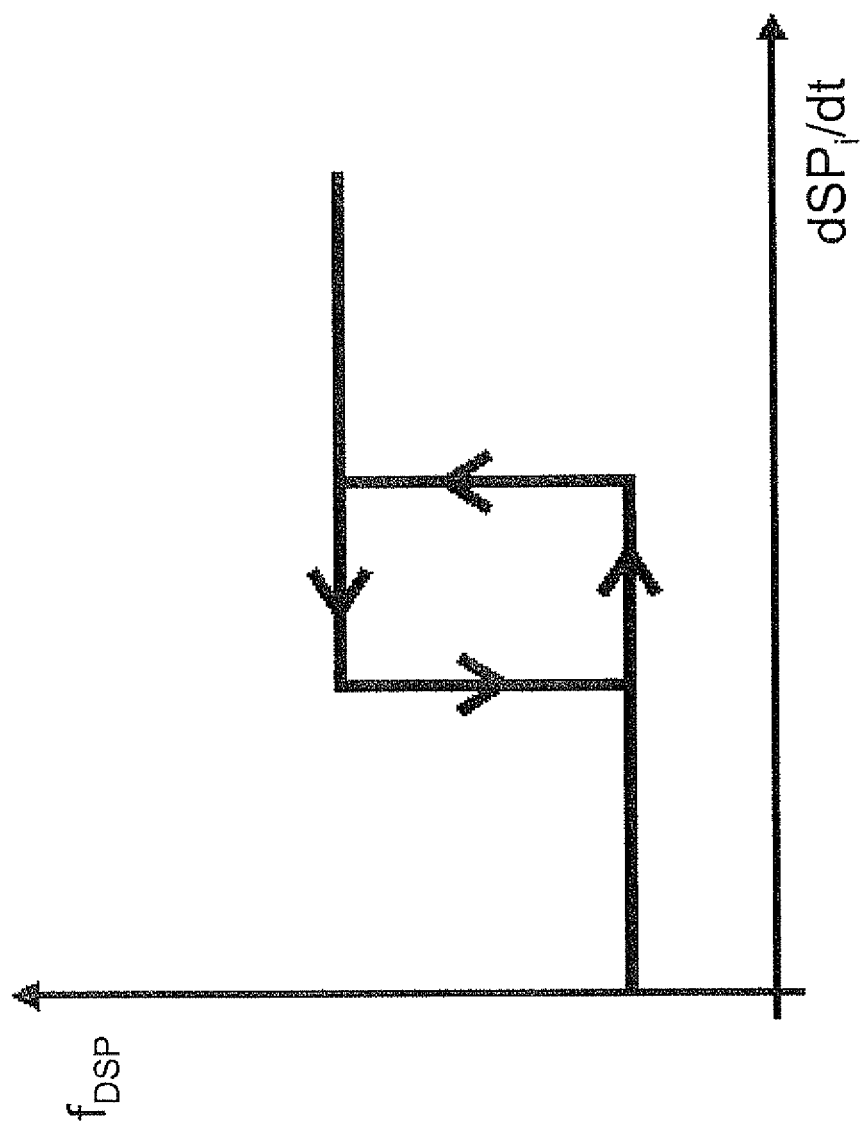

APPLICATION-SPECIFIC INTEGRATED CIRCUIT AND MEASUREMENT TRANSMITTER HAVING SUCH A CIRCUIT

TECHNICAL FIELD

The present invention relates to an electronic circuit, especially an integrated circuit, especially an application-specific integrated circuit, and to a measurement transmitter having such a circuit.

BACKGROUND DISCUSSION

Application-specific integrated circuits are known per se and are applied, for example, in measurement transmitters of industrial process measurements technology, in order, for example, to operate a sensor having an analog electrical transducer and to digitize and condition its analog, primary signals as well as to forward output signals to superordinated units.

Modern measurement transmitters must function in a large number of fields of use and be able to handle the most varied of requirements for accuracy of measurement and dynamic range. Additionally, the components of the measurement transmitter should, in the ideal case, be scalable in their performance and flexible as regards energy consumption.

SUMMARY OF THE INVENTION

It is, consequently, an object of the present invention to provide an electronic circuit, especially an application-specific circuit and a measurement transmitter, which respectively largely meet these requirements.

The object is achieved by the electronic circuit, especially the application-specific integrated circuit, comprising: n analog inputs having analog-digital converters, wherein n>=1; and at least one digital processor, especially a digital signal processor, which has input registers and output registers, wherein: said one or more analog-digital converters sample and digitize input signals $S_i$ (which depend on present values of measured variables) with sampling frequencies $f_{Si}$ and forward said digitized signals $SD_i$ with output frequencies $f_{SD\text{-}out\text{-}i}$ to said input registers of the digital signal processor; said digital signal processor processes the digitized signals $SD_i$ to m processed signals $SP_j$ and forwards such to said output registers of said digital signal processor, said digital signal processor has a clock frequency $f_{DSP}$; m>=1, and j=1, . . . , m; furthermore, the signals $SP_j$ of said output registers can be output, respectively read-out, with an output frequency $f_{SP\text{-}out\text{-}j}$; one or more of the frequencies $f_{SD\text{-}out\text{-}i}$, $f_{DSP}$, $f_{SP\text{-}out\text{-}j}$ is, respectively are, variable; and one or more of the frequencies $f_{SD\text{-}out\text{-}i}$, $f_{DSP}$, $f_{SP\text{-}out\text{-}j}$ is, respectively are, variable independently of the others of said frequencies.

The electronic circuit of the invention, especially the application-specific integrated circuit of the invention, comprises: n analog inputs having analog-digital converters ($ADC_i$), wherein n>=1; at least one digital signal processor (DSP), which has input registers and output registers, wherein the one or more analog-digital converters (ADC) sample and digitize input signals $S_i$ (which depend on present values of measured variables) with sampling frequencies $f_{Si}$ and forward the digitized signals $SD_i$ with output frequencies $f_{SD\text{-}out\text{-}i}$ to the input registers of the digital signal processor, wherein the digital signal processor (DSP) processes the digitized signals $SD_i$ to m processed signals $SP_j$ and forwards such to the output registers of the digital signal processor (DSP), wherein the digital signal processor has a clock frequency $f_{DSP}$, wherein m>=1, and j=1, . . . , m, wherein, furthermore, the signals $SP_j$ of the output registers can be output with an output frequency $f_{SP\text{-}out\text{-}j}$, wherein, according to the invention, one or more of the frequencies $f_{SP\text{-}out\text{-}i}$, $f_{DSP}$, $f_{SP\text{-}out\text{-}j}$ is, respectively are, variable, wherein especially one or more of the frequencies $f_{SD\text{-}out\text{-}i}$, $f_{DSP}$, $f_{SP\text{-}out\text{-}j}$ is, respectively are, variable independently of the others of the said frequencies.

In a further development of the application-specific integrated circuit, the one or more frequencies $f_{SD\text{-}out\text{-}i}$, $f_{DSP}$, $f_{SP\text{-}out\text{-}j}$ depends, respectively depend, at least on at least one of the digitized measurement signals $SD_i$ or on a variable dependent thereon.

In a further development of the invention, the one or more frequencies $f_{SD\text{-}out\text{-}i}$, $f_{DSP}$, $f_{SP\text{-}out\text{-}j}$ depend on the time derivative and/or on another function dependent on the time behavior of the at least one digitized measurement signal $SD_i$.

In a further development of the invention, the one or more frequencies $f_{SD\text{-}out\text{-}i}$, $f_{DSP}$, $f_{SP\text{-}out\text{-}j}$ depends, respectively depend, on the standard deviation of the at least one digitized measurement signal $SD_i$ or a variable dependent thereon.

The measurement transmitter of the invention comprises: an application-specific integrated circuit of the invention; and a controller, wherein the controller receives at least one output signal $SP_j$ from the digital signal processor (DSP) and, as a function of the received output signal $SP_j$, outputs a response signal $S_r$ to the integrated circuit, wherein at least one of the said frequencies $f_{SD\text{-}out\text{-}i}$, $f_{DSP}$, $f_{SP\text{-}out\text{-}j}$ of the integrated circuit is variable as a function of the response signal $S_r$.

In a further development of the invention, the response signal $S_r$ comprises a control signal, or the controller generates such a control signal, with which a desired value for at least one of the variable frequencies $f_{SD\text{-}out\text{-}i}$, $f_{DSP}$, $f_{SP\text{-}out\text{-}j}$ of the integrated circuit is predetermined.

In a further development of the invention, the response signal $S_r$ comprises a processed measured value, based on which the integrated circuit ascertains a desired value of the variable frequency $f_{SD\text{-}out\text{-}i}$, $f_{DSP}$, $f_{SP\text{-}out\text{-}j}$.

In a further development of the invention, the response signal $S_r$ comprises the time derivative of a measured value or its standard deviation.

In a further development of the invention, the controller has supplemental functions, which comprise, for example, the application-specific calculating, by means of a tank profile, of a fill quantity in a tank based on a signal $SP_j$ representing a hydrostatic pressure or the determining of a flow velocity by registering a pressure difference signal.

BRIEF DESCRIPTION OF THE DRAWINGS

The invention will now be explained in greater detail based on the examples of embodiments illustrated in the drawing, the figures of which show as follows:

FIG. 2a is the time behavior of signals of an ASIC with fixed frequencies, respectively frequency ratios, according to the state of the art;

FIG. 2b is the time behavior of signals of an ASIC of the invention with variable frequencies, respectively frequency ratios;

FIG. 3 is an example of the control of the clock frequency fDSP of the digital signal processor based on the time derivative of an output signal SPi;

DETAILED DISCUSSION IN CONJUNCTION WITH THE DRAWINGS

Figure 1:
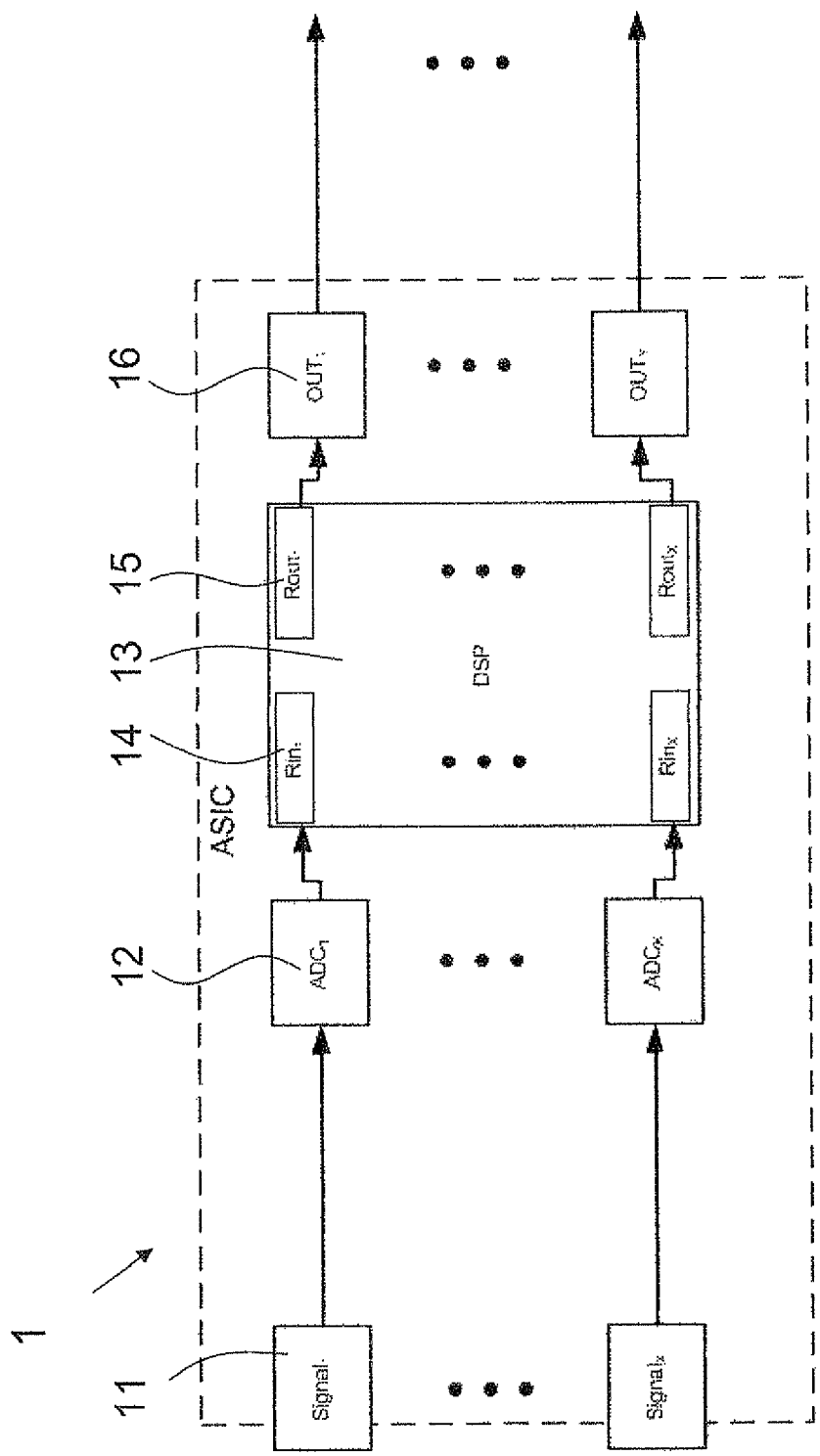
FIG. 1 is a schematic representation of a first example of an embodiment of an application-specific integrated circuit (ASIC) of the invention.

The application-specific integrated circuit (ASIC) 1 shown in FIG. 1 has n analog signal inputs 11, on which are applied, for example, the voltages and/or electrical currents of a bridge circuit of a (piezo-) resistive pressure sensor or of a measuring circuit of a capacitive pressure sensor, a temperature sensor, and/or some other measuring transducer.

The analog signals $S_i$ (referenced in FIG. 1 as $Signal_1$ to $Signal_x$) are sampled by analog-digital converters 12 with sampling frequencies $f_{Si}$ and digitized and the digitized signals $SD_i$ forwarded with output frequencies $f_{SD-out-i}$ to input registers ($Rin_{1...x}$) 14 of a digital signal processor 13. The analog-digital converters can especially be sigma-delta converters.

The n signals $SD_i$ inserted into the input registers are processed by the signal processor 13 to form m processed signals $SP_j$ and sent to the output registers ($Rout_{1...x}$) of the digital signal processor (DSP).

This processing can comprise, for example, the ascertaining of a pressure measured value, which, based on two signals SD1, SD2 each representing a capacitance measured value and on a signal SD3 representing a temperature measured value, is calculated by means of a compensation model, whose coefficients are provided from a memory (not shown), and is then placed as output signal $SP_j$ in at least one output register 15.

Other forms of processing can include, for example, a filtering of the entering signals.

The digital signal processor has an output frequency $f_{DSP}$, which amounts to, for example, 1 kHz or some 100 Hz. The DSP completes the running of its program in, for example, 1.25 ms. The program includes, for instance, up to 400 commands. The clock frequency then amounts to, for instance, 300 kHz. In the case of the slowest clock frequency, a calculating cycle takes, for instance, 160 ms. The clock frequency then amounts to only somewhat more than 2 kHz.

The signals are output, respectively read-out, from the output registers with output frequencies $f_{SP-out-j}$.

An output register 15 can be read-out, for example, by a digital-analog converter with a high frequency, in order to be able to provide a dense sequence of measured values to an analog output. The output register can also be operated with a lower frequency than that of a DSP cycle.

Another output register can concern, for example, a drag pointer value, which is downloaded with a significantly lesser frequency.

According to the invention, one or more frequencies $f_{SD-out-i}$, $f_{DSP}$, $f_{SP-out-j}$ is, respectively are, variable, and, indeed, preferably independently of one another.

This situation distinguishes from the state of the art and is presented on the basis of the comparison in FIGS. 2a and 2b, wherein according to FIG. 2a all said frequencies are essentially equal. This leads to a comparatively rigid system, in the case of which frequency adaptings, for example, for reduction of the power consumption, affect all power features of the ASIC. In contrast, in the case of an ASIC of the invention, the frequencies are adapted to the needs the specific measuring situation. Thus, the frequency $f_{SD-out-1,2}$ can be, for example, the output rate of the above mentioned, digitized, capacitance measured values, while, in a thermally slow system, the frequency $f_{SD-out-3}$ is rather low for the slowly changing temperature measured values. Correspondingly, the output frequencies from the output registers of the DSP 13 can vary as needed.

FIG. 3 shows an example of control of the clock frequency of the digital signal processor as a function of the time derivative $dSP_i/dt$ of an output signal $SP_i$ of the digital signal processor. When the time derivative $dSP_i/dt$ exceeds a threshold value, the clock frequency is increased by a constant value. In order that the clock frequency does not, however, continually jump back and forth between two frequencies, when the time derivative moves in the vicinity of the threshold value, a hysteresis is provided, according to which the clock frequency only sinks, when the derivative notably subceeds the threshold value. This controlling of the clock frequency of the digital signal processor can be performed by the ASIC or, in given cases, by a superordinated unit, depending on the particular embodiment of the invention.

Figure 4A:
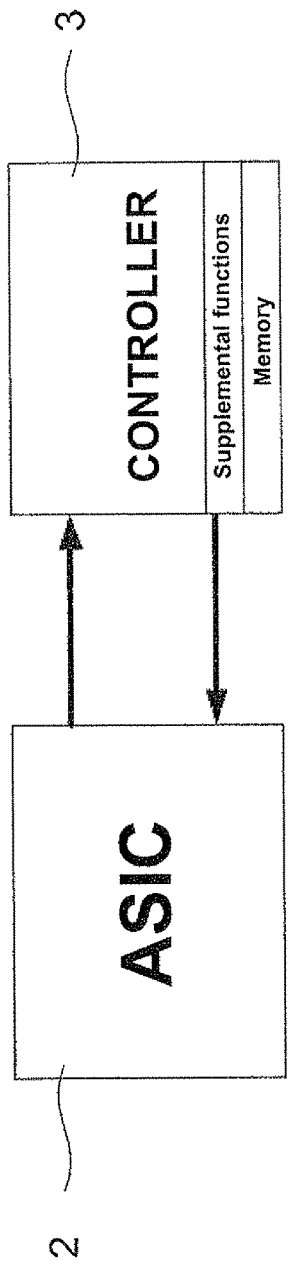
FIG. 4a is a first schematic representation of a measurement transmitter of the invention.
Figure 4B:
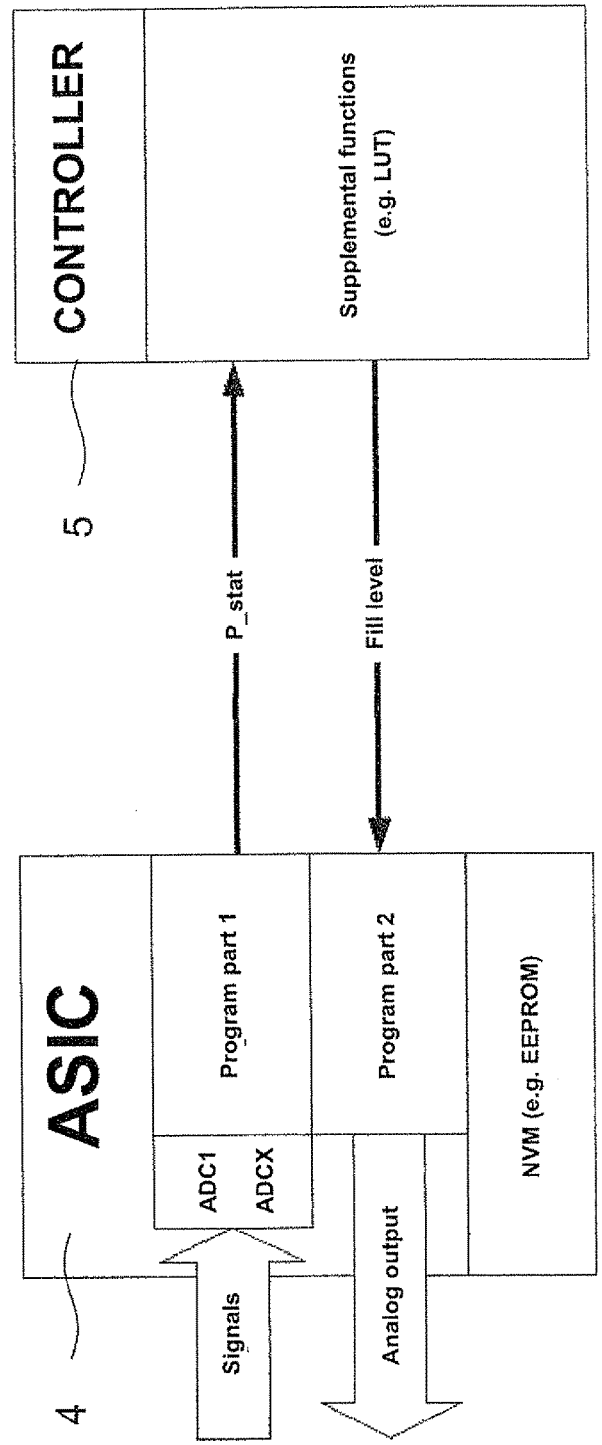
FIG. 4b is a second, more detailed, schematic representation of a measurement transmitter of the invention.

For explaining the influencing of the frequencies by means of a superordinated unit, reference is now made to FIGS. 4a and 4b.

FIG. 4a shows the simple case of a measurement transmitter that has an ASIC 2, which is connected to a controller 3, wherein the controller 3 performs supplemental functions in the evaluation of the signals $SP_j$ of the DSP of the ASIC 2. Here, it can ascertain, for example, the time derivative $dSP_j/dt$ of a signal $SP_j$ and then output a desired value for one or more of the variable frequencies to the ASIC 2 as response signal. The response signal can have an index value, according to which the ASIC has to read the desired value from a memory, or a concrete frequency value can be transmitted.

FIG. 4b shows a more detailed representation of a measurement transmitter having an ASIC 4 and a controller 5. The ASIC ascertains by means of its digital signal processor in a first program part a static pressure, whose signal p_stat is transmitted to the controller 5. The controller contains in a table (LUT, for Look Up Table), for example, a profile of a tank and can then, based on the pressure signal p_stat, calculate the fill volume in $m^3$, respectively the mass in t. The corresponding fill level signal is transmitted to the ASIC as response signal, in order, for example, to be processed via a second program part of the ASIC and then output to the analog output of the ASIC.

The ASIC includes furthermore a non-volatile memory (NVM), in which desired values for the variable frequencies are stored as a function of fill level. The ASIC can thus now, based on the response signal from the controller representing e.g. the fill level, perform the required frequency adaptings, in order, for example, in the case of threatening limit value exceeding or subceeding to be able to provide signals at a higher rate, for example, for pump protection or for overfilling prevention.

The invention claimed is:

1. An electronic circuit, especially an integrated circuit, especially an application-specific integrated circuit, comprising:
   n analog inputs having analog-digital converters, wherein n>=1; and
   at least one digital processor, especially a digital signal processor, which has input registers and output registers, wherein:

said one or more analog-digital converters sample and digitize input signals $S_i$ (which depend on present values of measured variables) with sampling frequencies $f_{Si}$ and forward said digitized signals $SD_i$ with output frequencies $f_{SD-out-i}$ to said input registers of the digital signal processor;

said digital signal processor processes the digitized signals $SD_i$ to m processed signals $SP_j$ and forwards such to said output registers of said digital signal processor, said digital signal processor has a clock frequency $f_{DSP}$; m>=1, and j=1, . . . , m;

furthermore, the signals $SP_j$ of said output registers can be output, respectively read-out, with an output frequency $f_{SP-out-j}$;

one or more of the frequencies $f_{SD-out-i}$, $f_{DSP}$, $f_{SP-out-j}$ are, variable independently of the others of said frequencies;

said one or more frequencies depends, at least on at least one of said digitized measurement signals $SD_i$ or on a variable dependent thereon; and said one or more frequencies $f_{DSP}$, $f_{SP-out-j}$ depends, on the standard deviation of said at least one digitized measurement signal $SD_i$ or a variable dependent thereon.

2. The application-specific integrated circuit as claimed in claim 1, wherein:

said one or more frequencies $f_{SD-out-i}$, $f_{DSP}$, $f_{SP-out-j}$ depends, on the time derivative and/or on another function dependent on the time behavior of said at least one digitized measurement signal $SD_i$.

* * * * *